United States Patent [19]

Christensen et al.

[11] Patent Number: 5,000,652
[45] Date of Patent: Mar. 19, 1991

[54] WAFER TRANSFER APPARATUS

[75] Inventors: Richard G. Christensen, Pine Plains; Alfred Mack, Poughkeepsie, both of N.Y.

[73] Assignee: International Business Machines Corporation, Armonk, N.Y.

[21] Appl. No.: 421,026

[22] Filed: Oct. 13, 1989

Related U.S. Application Data

[63] Continuation of Ser. No. 176,891, Apr. 4, 1988, abandoned, which is a continuation of Ser. No. 909,649, Sep. 22, 1986, abandoned.

[51] Int. Cl.$^5$ .............................................. B25J 15/10
[52] U.S. Cl. .............................. 414/744.3; 414/744.8; 294/93; 901/36
[58] Field of Search ................. 414/225, 744.1, 744.3, 414/744.8, 751, 753, 744.2; 901/36, 37, 39; 294/93, 99.1, 119.3

[56] References Cited

U.S. PATENT DOCUMENTS

| | | | |
|---|---|---|---|
| 3,343,864 | 9/1967 | Baer | 294/99 |
| 4,030,622 | 6/1977 | Brooks et al. | |
| 4,042,128 | 8/1977 | Shrader | |
| 4,061,627 | 6/1986 | Oka | 414/225 |
| 4,173,365 | 11/1979 | Lieb | 294/19 R |
| 4,453,757 | 6/1984 | Soraoka | 294/96 R |
| 4,465,416 | 8/1984 | Burkhalter et al. | 414/217 |
| 4,466,766 | 5/1983 | Geren | 414/404 |
| 4,474,399 | 10/1984 | Lauber | 294/88 |
| 4,504,186 | 3/1985 | Richards | 414/744 A |
| 4,530,636 | 7/1985 | Inaba | 414/730 |
| 4,540,211 | 9/1985 | Masserang | 294/88 |
| 4,553,069 | 1/1984 | Purser | 315/111.81 |
| 4,653,793 | 3/1987 | Guinet et al. | 294/86.4 |

FOREIGN PATENT DOCUMENTS

| | | |
|---|---|---|
| 922331 | 3/1973 | Canada . |
| 3434009 | 3/1986 | Fed. Rep. of Germany . |
| 54-41075 | 3/1979 | Japan . |
| 58-64041 | 4/1983 | Japan . |
| 58-84438 | 5/1983 | Japan . |
| 59-115400 | 8/1984 | Japan . |
| 59-156688 | 9/1984 | Japan . |
| 60-194490 | 12/1985 | Japan . |
| 60-262437 | 12/1985 | Japan . |
| 516609 | 6/1976 | U.S.S.R. . |
| 1192971 | 11/1985 | U.S.S.R. . |

OTHER PUBLICATIONS

G. Delannoy, IBM Technical Disclosure Bulletin, vol. 25, No. 5, Oct., 1982, "Holder Device for Handling Semiconductor Wafers", pp. 2334-2335.

Primary Examiner—Robert J. Spar
Assistant Examiner—William M. Hienz
Attorney, Agent, or Firm—John D. Crane; James R. Warnot, Jr.

[57] ABSTRACT

A wafer transfer apparatus used in manufacturing high density semiconductor products is disclosed which includes at least three movable arms for supporting a wafer from below thereby preventing contact with the active surface of the wafer. A mechanism for moving the arms into and out of its wafer supporting position is diposed, in part, above the wafer when a wafer is supported thereby. The portions of the actuator mechanism disposed above the wafer are constructed in a way such that no sliding contact occurs between elements thereof. Sliding contact between elements disposed above a wafer has proved to produce microscopic particles which can fall onto the active surface of the wafer thereby contaminating the circuits contained thereon. As sliding contact is avoided by the apparatus of the present invention, contamination particles produced within the wafer transfer apparatus is substantially reduced, if not entirely eliminated.

28 Claims, 3 Drawing Sheets

WAFER TRANSFER APPARATUS

This patent application is a continuation of U.S. Pat. application Ser. No. 07/176,891, filed Apr. 4, 1988, now abandoned which is a continuation of U.S. Pat. application Ser. No. 06/909,649, filed on Sept. 22, 1986, now abandoned.

BACKGROUND OF THE INVENTION

The present invention relates broadly to the field of manufacturing equipment and particularly to the field of moving delicate semiconductor wafers from one position to another.

In the field of automated material handling, much has been done to permit automated manufacture of such semiconductor wafers. For example, U.S. Pat. No. 4,030,622 issued June 21, 1977 shows a wafer handling system for transporting delicate silicon wafers into and out of a vacuum chamber. In that system, a vibrating track is used to move the silicon wafer from one position to another. History has proven that the use of vibrational tracks to transport wafers from one location to another is undesirable as the wafers are so fragile that they frequently break while being moved on such vibrational tracks.

A holder device for handling semiconductor wafers is illustrated in the IBM Technical Disclosure Bulletin, Vol. 25, No. 5, Oct. 1982 pages 2334-2335. This holder uses a gripper which only contacts the edge of a wafer and not the active surface of a wafer. The mechanism shown there, however, is disposed over the active surface and has moving members which are in sliding contact with other members thereof. Sliding contact of the members, however, produces minute contamination particles as the pieces rub against each other in normal use. These particles can fall onto the active surface of a wafer disposed below them and cause failures thereon. Accordingly, such an apparatus contributes to reducing the manufacturing yield and for this reason is undesirable. The mechanism is also undesirable because edge contact does cause some breakage of wafers which further contributes to reduced manufacturing yield.

U.S. Pat. No. 4,042,128 issued Aug. 16, 1977 illustrates another wafer transfer apparatus. In this apparatus, there is a substrate carrier with a plurality of stand-off supports. A substrate is positioned on the carrier so that the edges thereof rest on a sloping surface of the standoffs. As such, each substrate is supported by only its edge at several points around its circumference. In practice, this support method causes excessive substrate edge breakage which contributes to reduced manufacturing yield and, hence, is not desirable.

U.S. Pat. No. 4,466,766 illustrates yet a further apparatus for transferring wafers from a process carrier to a furnace carrier. As with other transfer devices described earlier, this one engages the edge of the wafer as well which contributes to wafer breakage in the manufacturing processes. It also has mechanisms disposed above the wafers which have sliding contact with other mechanism which may produce tiny metal particles that can fall onto the active surface of the wafer which may result in the formation of a circuit defect. Accordingly, in applications where super clean conditions must be maintained and high manufacturing yield is required, the transfer device of the subject patent is not suitable.

In view of the above noted problems associated with prior art wafer handling equipment, it is the primary objective of the present invention to provide a wafer transfer mechanism which enhances the manufacturing yield.

It is a further objective of the present invention to provide a wafer transfer mechanism which does not does not contribute to wafer breakage.

It is another objective of this invention to provide a wafer transfer device which does not have any elements thereof disposed above the active surface of the wafer which are in sliding contact with any other element thereof thereby eliminating a source of particles which might fall on the active surface and cause a circuit defect.

It is still another objective of this invention to provide a wafer transfer device which can operate in manufacturing equipment where only a small vertical opening is available in which to position and operate the wafer transfer device.

BRIEF DESCRIPTION OF THE INVENTION

In accomplishing these and other objectives of this invention, the new wafer transfer device described herein has at least three wafer supporting arms each having an inwardly projecting flange. The transfer device positions the arms so that the flanges are disposed in a plane below the plane of the support on which a wafer rests. An actuator mechanism disposed above the active surface of the wafer moves the arms inwardly until the flange on each arm underlies the back surface of the wafer but the arms are not in contact with the wafer edge. Then, the arms are moved upwardly. When the flanges contact the back surface of the wafer, the wafer is lifted off the support. Once the arms are above the support surface, the transfer device can be moved to carry the wafer to another position.

The actuator mechanism disposed above the active surface of the wafer is designed without any movable element thereof having any sliding contact with any other element thereof. Because, there are no parts of the transfer device which are in sliding contact with other elements thereof, no small particles can be produced that might fall on the active surface of a wafer and cause a defect thereon.

BRIEF DESCRIPTION OF THE DRAWINGS

The foregoing and other objects, advantages and features of the present invention are described below in connection with the figures which form a part of the original disclosure wherein.

DETAILED DESCRIPTION

In the field of semiconductor manufacture, circular wafers comprise a substrate on which a plurality of semiconductor circuits are formed. These wafers are typically very thin and economic pressure on manufacturers is increasingly forcing the use of larger diameter wafers in manufacturing processes. The trend to the use of larger diameter wafers has produced a negative side effect in that these wafers are more difficult to handle and are quite easily broken during such handling.

The wafer transfer apparatus of the present invention is particularly designed for moving a wafer from one position to another. During this transfer, the wafer remains disposed generally in a horizontal position with the active surface facing up. The only contact between the transfer mechanism and the wafer carried thereby is against the inactive or bottom surface of the wafer.

Figure 2:
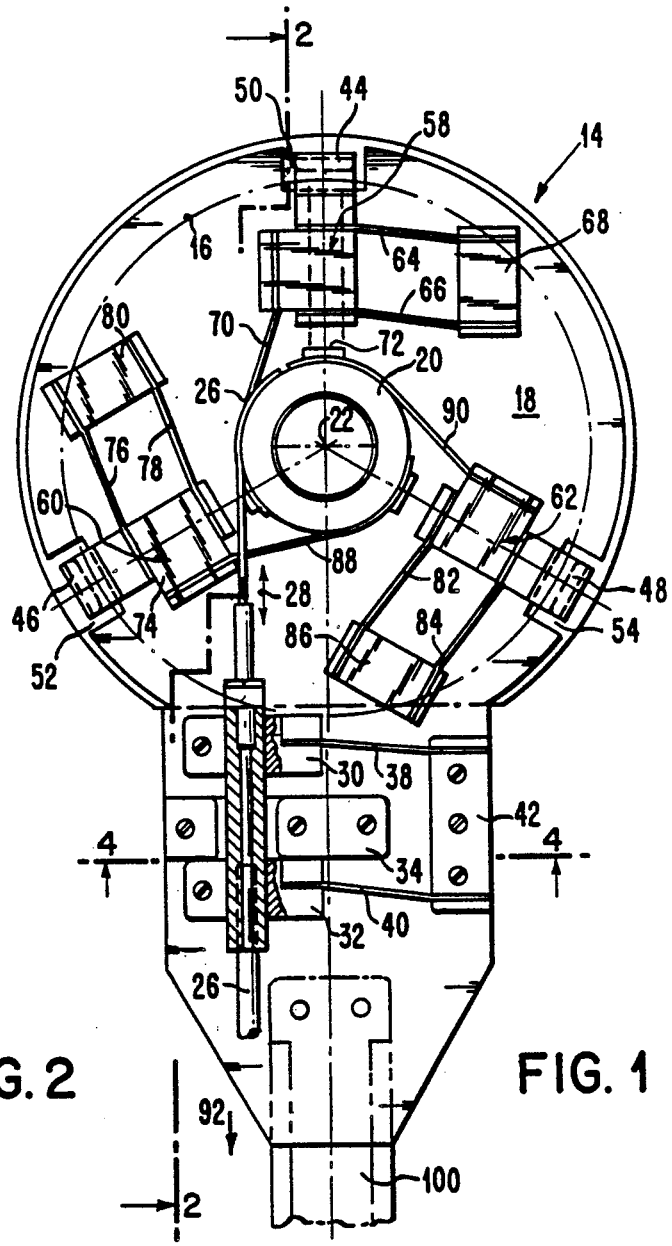
FIG. 2 is a sectional view of the wafer transfer apparatus taken along section line 2—2 of FIG. 1 in the direction of the arrows.

As illustrated in FIG. 2, a circular wafer 10 of the type utilized by semiconductor manufacturers in producing large scale integrated circuits is disposed on top of a carrier 108. Disposed above the wafer 10 and the carrier 108 is the wafer transfer apparatus of the present invention as illustrated generally at 14. As will be described hereinafter in greater detail, the wafer transfer apparatus 14 as illustrated in FIG. 2 is disposed in a position with respect to the wafer 10 for either grasping or releasing the wafer.

Figure 1:
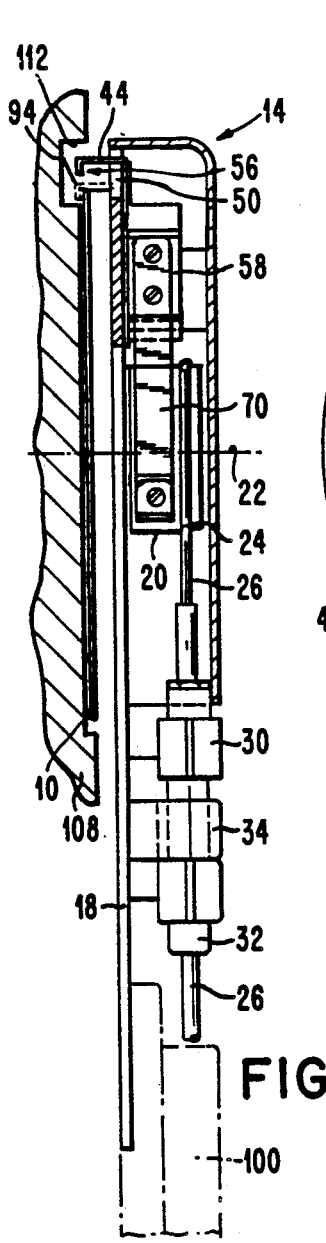
FIG. 1 is a plan view of the wafer transfer apparatus of the present invention.

As viewed in FIG. 1, the wafer transfer apparatus 14 is disposed above the wafer 10 whose position is indicated by the circular dotted line 16.

The wafer transfer apparatus 14 has a base member 18 to which a circular hub member 20 is mounted for rotation about an axis 22 which is disposed vertical to the plane occupied by the base member 18. The circular hub member 20 is preferably coupled to the base member 18 in a manner permitting rotation of the hub member 20 with respect to the base member 18 without having any sliding contact between these members. This objective can be readily achieved by utilizing a roller bearing or a ball bearing assembly illustrated generally at 19 in FIG. 3. The central ring thereof is attached by a screw or the like to the base portion 18A. The outer ring of the bearing 19 comprises the hub member 20 illustrated in FIG. 1.

Figure 3:
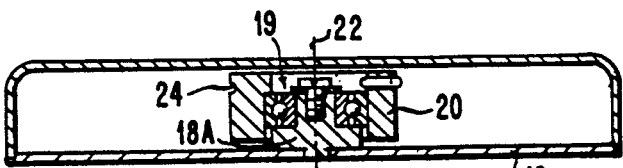
FIG. 3 illustrates the preferred manner of rotationally mounting a hub member to a base member of the wafer transfer apparatus.

A groove 24 is formed in the outer surface of the circular hub member 20 and disposed near the top thereof as illustrated in FIGS. 2 and 3. This groove 24 is for receiving a portion of a cable 26 one end of which is anchored to the circular hub member 20. The cable 26 is actuated, in a manner to be described later, so as to move in either direction indicated by the double headed arrow 28, thereby causing the circular hub member 20 to rotate about the vertical axis 22.

Mounted on the cable 26 are two stop members 30 and 32. After the cable 26 is moved up as viewed in FIG. 2, the stop member 32 comes into abutting contact with 1 bottom face of a stop member 34 which is affixed to the base member 18 by any suitable means. When the cable 26 is moved down as viewed in FIG. 2 the stop member 30 comes into abutting contact with the opposite face of a stop member 34. Accordingly, the stop members 32 and 34 cooperate together to limit the movement of the cable 26 in a direction causing the hub member 20 to rotate in either a clockwise or counterclockwise direction.

Figure 4:
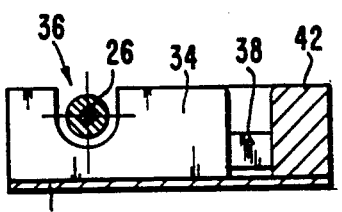
FIG. 4 is a sectional view taken along section line 4—4 of FIG. 1 and viewed in a direction toward the wafer contacting parts of the wafer transfer apparatus as indicated by the arrows.

As illustrated in FIG. 4 the stop member 34 has a slot 36 in the upper surface thereof in which the push-pull cable 26 is disposed. By reason of the fact that the slot 36 is larger than the cable 26, the cable 26 can be positioned, with the apparatus to be described later, in such a manner that it never comes in sliding contact with the surface of the groove 36. This is advantageous as sliding contact has proven to be a source of small particles which, in the typical clean room environment of a semiconductor manufacturer, is not desirable as these particles may land on an active surface of a substrate being manufactured thereby producing a circuit flaw.

The cable 26 is supported by two leaf springs 38 and 40 which, as illustrated in FIG. 1, are respectively attached at one end to the stops 30 and 32 and at their other end to a retainer block means 42. The leaf springs 38 and 40 are preferably made of stainless steel and are disposed in a generally vertical plane, thereby providing sufficient rigidity so as to support the cable 26 in a position within slot 36 so that it does not strike the walls of the slot 36 as illustrated in FIG. 4. In this manner, sliding contact of the cable 26 with the slot 36 is prevented.

The wafer transfer apparatus illustrated in FIG. 2 has a plurality of wafer support arms 44, 46 and 48. These arms are respectively disposed with respect to the base member 18 so as to project through openings 50, 52 and 54. As is best illustrated with respect to arm 44 in FIG. 2, each of the arms 44, 46, and 48 has a flange portion thereof, illustrated at 56 in FIG. 2 for the arm 44, which projects towards the axis 22, and provides a substantially horizontal surface which, as will become clearer later, is used to support a wafer 10 from underneath.

The arms 44, 46 and 48 are respectively mounted on an arm support member 58, 60 and 62 by any suitable attachment mechanism. The arm support members 58, 60 and 62 are preferably made of stainless steel, although other materials could be utilized therefor. The arm support member 58 is disposed at one end of two leaf springs 64 and 66. The opposite end of these leaf springs 64 and 66 are secured to a support member 68 which is mounted on the base member 18. The size and shape of the arm 44, the arm support member 58, the leaf springs 64 and 66 and the support member 68 is dictated by the objective of avoiding sliding contact between movable members. Accordingly, the leaf spring 64 and 66 are attached to the support member 68 at a point above the base member 18 and the support members 64 and 66 are disposed in parallel relation to the base 18 so that they do not come into contact with the base 18 either. The arm support member 58, which is attached to the end of the leaf springs 64 and 66, is attached in a way so that it does not come into contact with the base 18 either. Further, the arm 44 is attached to the arm support member 58 so that it as well does not contact the base 18 but projects through the opening 50, as illustrated in FIG. 2.

The arm support member 58 is coupled by a metal band 70 which is secured at one end thereof to the arm support member 58 and at the other end thereof to the circular hub member 20. As the leaf springs 64, 66 and metal band 70 are preferably made of thin stainless steel material having a wider dimension disposed generally vertical to the base 18 as illustrated in FIG. 2, these leaf springs can provide support so that the arm support members 58, 60 and 62 do not touch the base 18 and yet the support members 58, 60 and 62 can each be moved along a path which passes through the axis 22.

The support member 68 is secured to the base member 18 in such a manner that the leaf springs 64 and 66 are flexed so as to place the metal band 70 under tension which thereby disposes the arm member 44 at a position as far away from the axis 22 as is possible by this mechanical arrangement. A similar arrangement exists with respect to the arms 46 and 48. Particularly, the arm 46 is mounted on an arm support member 74 which is supported in part by two leaf springs 76 and 78. These leaf springs 76 and 78 are secured to a support member 80 which is attached to the base 18. The arm 48 is supported by the arm support member 62 which is in part supported by the two leaf springs 82 and 84 that are secured to a support member 86 affixed to the base 18. The arm support member 60 is coupled by yet another metal band 88 to the circular hub member 20 while the arm support member 62 is coupled by a metal band 90 to the hub member 20.

As with the support member 68, the leaf spring support members 80 and 86 are attached to the base 18 in a manner such that the leaf springs coupled thereto exert a force to push the arm associated therewith in a direction away from the axis 22. Accordingly, when the arms 44, 46, and 48 are disposed in the position as illustrated in FIG. 1, they are said to be located in the non-engaging position. That is, the assembly 14 can be raised or lowered with respect to the carrier 108 and the arms will be disposed in a position relative to a wafer 10 resting on the carrier 108 so that they will not come in contact with the wafer.

When the cable 26 is pulled in a direction indicated by the arrow 92, the hub member 20 is rotated in a counter clockwise direction. This counter clockwise motion is coupled by the leaf springs 70, 88 and 90 to the arm support members coupled thereto thereby causing the arms 44, 46 and 48 to be drawn inwardly toward the axis 22. When this occurs, the arms, such as arm 44, as illustrated in FIG. 2 are moved from their furthest out position to a position indicated in dotted lines in FIG. 2 at 94. In this latter position, the horizontal flange portion, such as 56, of each arm becomes disposed underneath the back surface of the wafer 10. The stop member 30, in this position, rests against the stop member 34 to thereby prevent further movement in the direction 92 by the cable 26. By selecting the dimensions of the various movable members discussed above, it is possible to control the distance which the arms move from their outer and non-engaging position to their innermost position, where, when the assembly is raised away from the carrier 108, the horizontal flange portion of each arm will come in contact with the back surface of the wafer. The dimensions of the elements are specifically selected so that when the arms are in their wafer engaging position, the vertical portion of the arms 44, 46 and 48 do not contact the outer rim of the wafer 10 and the only contact between the arms and the wafer is on the back surface at the point where the horizontal flange portion of each arm comes in contact therewith.

When the force on the cable 26 in the direction of the arrow 92 is released, the hub member 22 rotates in a clockwise direction by reason of the force exerted thereon by the flexed leaf springs 64, 66, 76, 78, 82 and 84. This causes the arms to move outwardly with respect to the axis 22 until such time as the stop member 32 comes in contact with the stop 34.

It should be observed at this point that all of the moving elements disposed within the wafer transfer apparatus 14 described to this point do not have any sliding contact with any other member. That is, no moving element rule or slides across any other member as one member moves relative to another. Examples of sliding contact include the contact of meshed gears, a cam and a cam follower, a piston ring and cylinder sidewall etc. There is rolling and abutting contact between the leaf springs 70, 88 and 90 and the hub member 20 but such rolling and abutting contact does not produce contamination particles which might fall from the apparatus 14 onto the upper or active surface of a wafer 10 when disposed underneath the apparatus 14. Accordingly, a principle objective of the present invention to prevent the formation of particles which could contaminate a wafer has been achieved.

The above description demonstrates that the actuator inter-element movement includes three portions. Inter-element movement can occur between a movable and a fixed element or between movable elements. A first portion of this movement includes first movable elements in rolling and abutting contact with a first set of the fixed and movable elements, such as the movement between the hub 20 and the bands 70, 88, 90. A second portion of this movement includes second movable elements in rolling contact with a second set of the fixed and movable elements, such as the movement between the balls and the races of the bearing 19. A third portion of this movement includes third movable elements in abutting contact with a third set of the fixed and movable elements, such as the movement between the stop members 30, 32 and the stop member 34.

Figure 5:
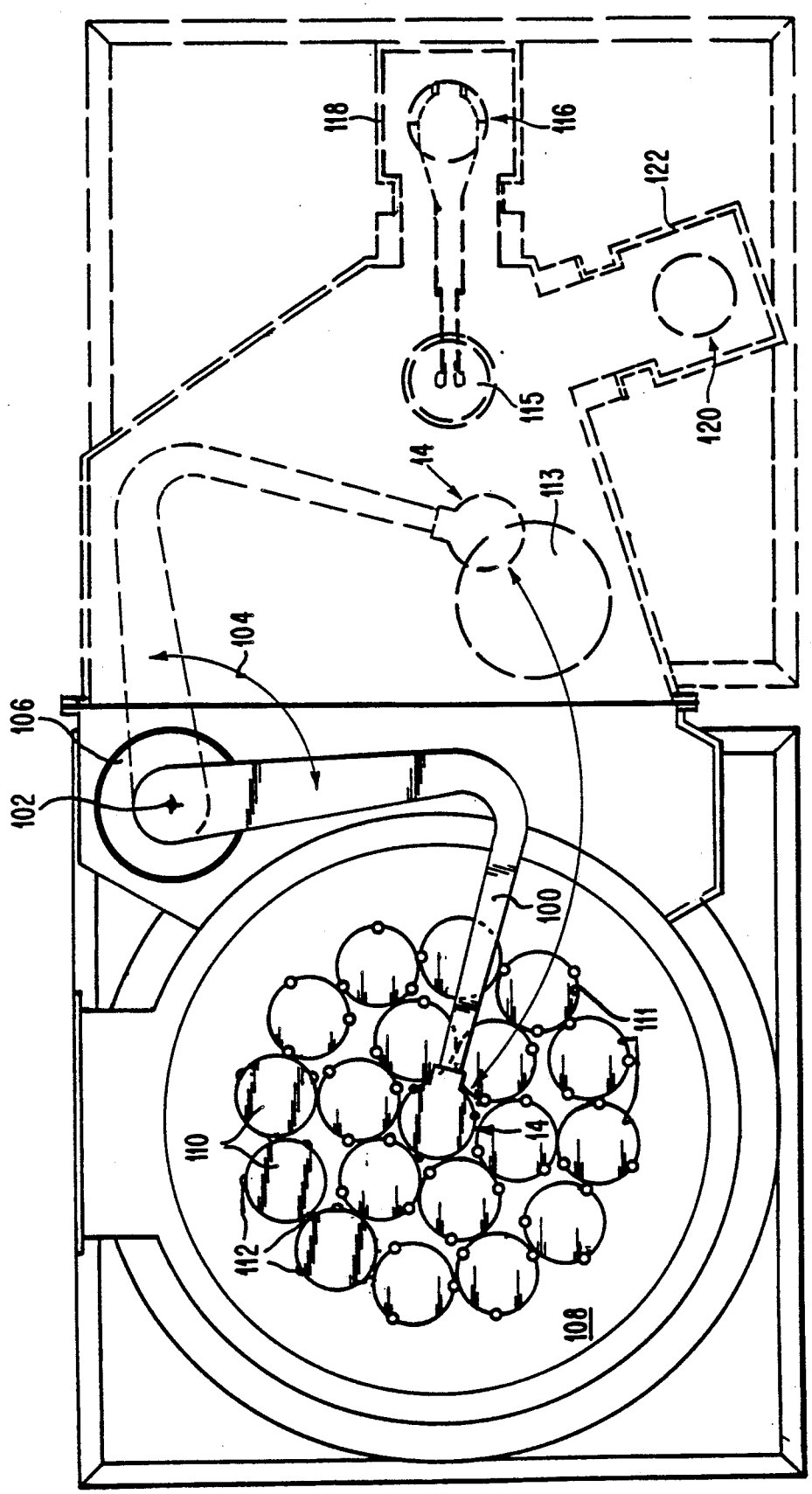
FIG. 5 illustrates a wafer transfer apparatus of the invention disposed on the end of a movable robot arm designed to position the wafer transfer apparatus at a desired location.

FIG. 5 schematically illustrates the wafer transfer apparatus of the present invention and particularly, the apparatus illustrated in the preceding figures when disposed at the end of a movable arm 100. The wafer transfer apparatus 14 is illustrated at one end of the arm 100 while the opposite end of the arm is coupled to a vertically disposed axle member 102 which may be rotated back and forth in the direction indicated generally by the double headed arrow 104 by a motor (not shown) which is disposed within a control unit 106. The wafer transfer apparatus 14 is shown disposed above a wafer carrier 108 which has a plurality of pockets therein such as the pockets illustrated at 111. Each of these pockets have a diameter slightly larger than the diameter of the largest wafer to be handled by the wafer carrier to the invention. Some of the pockets on the illustrated carrier 108 have a wafer 110 resting therein. As has already been mentioned, the wafer carrier 108 additionally has a plurality of depressions 112 in the upper surface thereof which are disposed around each of the pockets 111. These depressions 112 provide an area into which the arms 44, 46 and 48 of the mechanism illustrated in FIGS. 1 and 2 can be inserted when the wafer is either being placed on the carrier 108 or is being removed therefrom.

The wafer transfer apparatus of FIG. 5 generally operates in the following manner. The control unit 106 positions the movable arm 100 in a position such as is illustrated wherein the mechanism 14 is disposed directly above a pocket 111 on the wafer carrier 108. While at that position, the whole arm 100 and the axle member 102 is lowered vertically along the longitudinal axis passing through the member 102 thereby positioning the wafer transfer apparatus 14 in closer proximity to a wafer 110 which is resting on the upper surface of the carrier 108. In this position, the arms, such as 44 as illustrated in FIG. 2, extend into the depressions 112 so that the flange portions, such as 56 of the arm 44, is disposed below the plane in which the wafer 110 lies. Then by actuating the cable 26 to move the arms 44, 46 and 48 closer to the perimeter of a wafer 110, the flange portion 56 thereafter is positioned underneath the wafer 110. Then, when the arm 100 and the hub member 102 are raised vertically, the wafer 110 is lifted from the carrier 108 and rests on the flanges of the arms 44, 46 and 48 of the wafer transfer apparatus 14. Thereafter, the arm 100 is rotated until it is disposed directly above a module orienting station 113. The arm 100 is then lowered so that the wafer carried thereby can be placed on the orienting station 113. Then, a wafer mover illustrated at 115 moves the wafer from the orienting station 113 to a wafer carrier 116 disposed at a completed processing station illustrated at 118 where the wafers which have had processing completed thereon are stored prior to being transported in the carrier 116 to another processing station.

After the processed wafer is placed in the carrier 116, the mechanism 115 is operative to pick up another wafer such as illustrated at 120 from an unprocessed wafer station illustrated at 122. The unprocessed wafer 120 is then moved to the orienting station 113 by the mechanism 115 and positioned by the orienting station 113 so that the wafer is properly positioned for processing. Then the arm 100 is lowered and the unprocessed wafer is engaged in the manner described above by the wafer transfer mechanism of the present invention. The wafer transfer apparatus 14 is then moved so that it is disposed above an empty pocket 111 in the upper surface of the carrier 108. At this position, the arm 100 is again lowered and a wafer is placed onto the carrier 108.

The loading and unloading mechanism 115 comprises any suitable mechanism for transferring wafers between the orienting station 113 and either the cartridge 116 or the supply station 122 which itself may have a wafer cartridge. Such wafer handling devices are known in the art and need not be described here further.

It will be recognized by those of skill in the art that the stations 118 and 122 could in fact be the same station and, in this case, it would be designed to remove wafers from a cartridge and return wafers to that cartridge.

Figure 6:
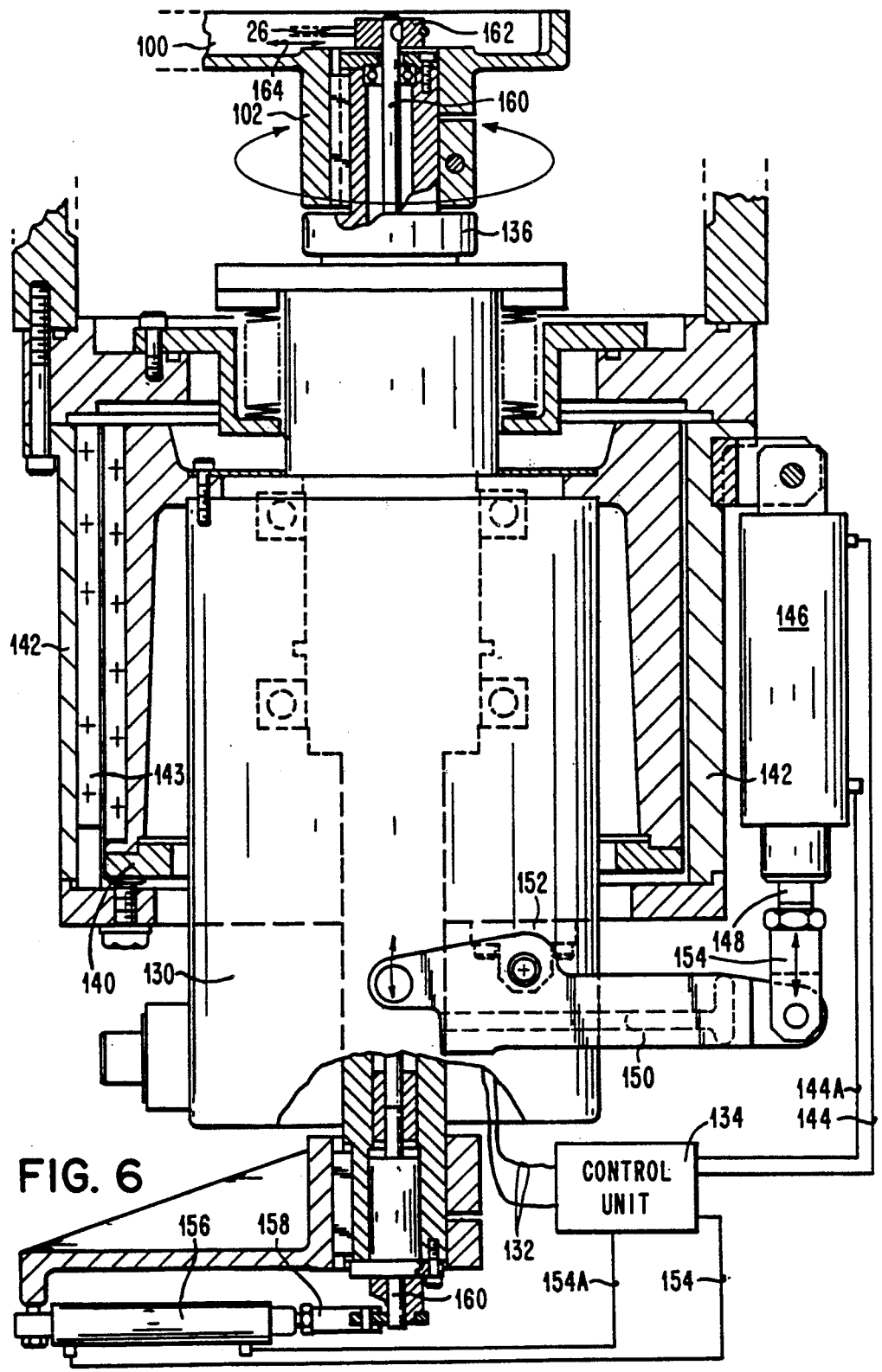
FIG. 6 illustrates the apparatus for rotating and vertically adjusting the position of the robot arm to position the wafer transfer apparatus in an area where there is a very small vertical gap in which to maneuver while picking up or leaving a wafer.

FIG. 6 illustrates the apparatus for raising and lowering as well as rotating the arm 100. The arm 100 is coupled to a motor 130 which is actuated by signals passing over the leads 132 from a control unit 134 to the motor 130. Any arrangement of control unit 134 and motor 130 which can provide precise rotational control of the drive shaft which couples to the arm 100 is suitable for this purpose.

The motor 130 is mounted in any suitable manner to be vertically movable with respect to a base member 142. In the illustrated embodiment, the motor is mounted on a body 140 which is substantially cylindrical and rides up and down in the body 142 on cross roller slides, one of which is illustrated at 143. There are many alternatives to this configuration which will be well understood to those of skill in the art.

The control unit 134 actuates a dual acting swivel mounted pneumatic cylinder 146 for extending or withdrawing the piston arm 148. The mechanism for actuating the cylinder 146 is conventional and lines 144 and 144A are shown between the control unit 134 and the cylinder 146 to illustrate the paths for the air used to control the position of the piston arm 148. The piston arm 148 couples by a coupler 154 to a rocker arm 150 which is disposed for pivoting about a horizontal axis indicated at 152. The other end of the rocker arm 150 is coupled by any suitable coupling means to the body 140 so that as the piston arm 148 moves in or out, the body 140 will respectively move down or up As the arm 100 is coupled to the body 140, the arm 100 is raised and lowered by the cylinder 146 under the control of the control unit 134.

The apparatus of FIG. 6 also includes means for actuating the cable 26. This actuation means includes a cylinder 156 coupled via air lines 154 and 154A to the control unit 134. The control unit 134 selectively actuates the cylinder 156 to move the piston 158 in or out. The piston 158 is coupled by any suitable means to a vertically disposed shaft 160 so that as the piston 158 moves in or out, the shaft 160 will rotate about the vertical axis therethrough. This causes the hub member 162 mounted on the upper end of the shaft 160 to rotate. As the cable 26 is coupled to the hub member 162, the cable 26 is moved either left or right as indicated by the double headed arrow 164 by the operation of the cylinder 156. In this manner, the arms 44, 46 and 48 can be moved so as to engage or disengage from a wafer.

The control unit 134 can be synchronized to the position of the wafer transfer apparatus 14 at the various positions illustrated in FIG. 5, whereat the mechanism can either pick up or put down a wafer. This synchronization by the control unit 134 is accomplished in a conventional manner and need not be described here in greater detail as such is well within the skill of the artisan in the field of the present invention.

While this invention has been particularly described with reference to the preferred embodiments thereof as illustrated in the drawings, it will be understood by those skilled in the art that the foregoing and other changes in form and detail may be made to the disclosed embodiments without departing from the spirit and scope of the invention as defined in the following claims.

What is claimed is:

1. An apparatus capable of carrying a disk shaped wafer and eliminating particulate contamination due to sliding contact comprising, in combination:

at least three non-deformable arms each having a flange projecting therefrom, each said flange being disposed in a common plane and providing, when said arms are at a wafer carrying position, a plurality of surfaces to support a wafer from below and providing, when said arms are at a wafer disengaging position, the capability to disengage a wafer; and mechanical actuator means including fixed elements and movable elements, said actuator means disposed above and coupled to each of said arms to support said arms and to move said arms simultaneously to either said wafer carrying position or said wafer disengaging position, wherein a first portion of inter-element movement includes rolling and abutting contact, a second portion of inter-element movement includes rolling contact, and a third portion of inter-element movement includes abutting contact.

2. The apparatus of claim 1 additionally including positioning means movable between a first and second position to raise and lower said arms between a corresponding upper and lower position, said positioning means being operative to position said arms such that movement of said arms to said wafer carrying position when said arms are in said lower position will cause said flanges to underlie a disk shaped wafer.

3. The apparatus of claim 2 wherein movement of said positioning means from said second position to said first position, while said arms are in said wafer carrying position, is operative to support a wafer on said flanges.

4. The apparatus of claim 3 additionally including means to move said arms and said actuator means orthogonally with respect to the direction of movement thereof between said upper and said lower position.

5. The apparatus of claim 1 wherein said actuator means comprise:
 a first element with a rotating mount permitting said first element to rotate about an axis, said rotating mount having moving elements in rolling contact therewith; and
 coupling means coupled between each of said arms and said first element, each of said coupling means being in abutting and rolling contact with said first element as said first element is rotated about said axis between two limits, one said limit being reached when said arms are at said wafer engaging position and said second limit being reached when said arms are at said wafer disengaging position.

6. The apparatus of claim 5 wherein said rotating mount is a ball bearing.

7. The apparatus of claim 5 wherein said rotating mount is a roller bearing.

8. An apparatus for carrying disk shaped wafers and eliminating particulate contamination due to sliding contact comprising, in combination:
 a housing having a base;
 at least three non-deformable arms with portions thereof projecting through and not contacting said housing base and disposed substantially equidistant from a perpendicular axis passing through said housing, each said arm including a substantially horizontal flange portion projecting from said arm toward said perpendicular axis; and
 actuator means having a plurality of elements at least some of which are movable, said plurality of elements being disposed in part within said housing and operable to move each of said arms either toward or away from said axis along a path which is substantially radial with respect to said axis, wherein a first portion of inter-element movement includes rolling and abutting contact, a second portion of inter-element movement includes rolling contact and a third portion of inter-element movement includes abutting contact.

9. The apparatus of claim 8 additionally including means to raise and lower said housing with respect to a wafer to be carried thereby.

10. The apparatus of claim 8 wherein said actuator means includes arm support means within said housing to support each of said arms and to permit movement of each of said arms without being in sliding contact with any other element disposed within said housing.

11. The apparatus of claim 10 wherein said arm support means includes a plurality of leaf spring means each attached at one end to said housing and at its other end to a respective one of said arms.

12. The apparatus of claim 11 wherein said leaf spring means disposed between each said arm and said housing provides a force tending to push each said arm away from said axis.

13. The apparatus of claim 10 additionally including a rotationally mounted hub disposed to rotate about said axis, said hub being coupled by a flexible band to each said arms.

14. The apparatus of claim 13 including means to selectively rotate said hub between two rotational limits, one rotational limit causing said arms to be disposed wide enough apart that the apparatus cannot carry a wafer and the second rotataional limit causing said arms to be disposed close enough together that said arms can carry a wafer on said flanges.

15. The apparatus of claim 13 wherein said arm support means comprises a plurality of support leaf springs, each disposed between a respective one of said arms and said housing, said springs providing a force tending to push each of said arms away from said axis.

16. The apparatus of claim 15 including means to selectively rotate said hub between two rotational limits, one rotational limit causing said arms to be disposed wide enough apart that the apparatus cannot carry a wafer and the second rotational limit causing said arms to be disposed close enough together that said arms can carry a wafer on said flanges.

17. The apparatus of claim 8 wherein said actuator means comprise:
 a first element with a rotating mount permitting said first element to rotate about an axis, said rotating mount having moving elements in rolling contact therewith; and
 coupling means coupled between each of said arms and said first element, each of said coupling means being in abutting and rolling contact with said first element as said first element is rotated about said axis between two limits, one said limit being reached when said arms are at said wafer engaging position and said second limit being reached when said arms are at said wafer disengaging position.

18. The apparatus of claim 17 wherein said rotating mount is a ball bearing.

19. The apparatus of claim 17 wherein said rotating mount is a roller bearing.

20. An apparatus for carrying disk shaped wafers and eliminating particulate contamination due to sliding contact comprising, in combination:
 a substantially horizontally disposed elongated arm mounted for rotation on a base member about a vertical axis, means to selectively raise and lower said elongated arm relative to said base member, and means to selectively rotate said elongated arm about said axis;
 a housing having a base disposed on said elongated arm at a position distal said axis;
 at least three non-deformable wafer support arms with portions thereof projecting through and not contacting said housing base and disposed substantially equidistant from a second vertical axis passing through said housing, each said support arm including a substantially horizontal flange projecting from said support arm toward said second vertical axis; and
 actuator means including a plurality of elements at least some of which are movable and at least some of said movable elements are disposed inside said housing and operable to move each of said support arms in unison either toward or away from said second axis along a path which is substantially radial with respect to said second axis, wherein a first portion of inter-element movement includes rolling and abutting contact, a second portion of inter-element movement includes rolling contact, and a third portion of inter-element movement includes abutting contact.

21. The apparatus of claim 20 additionally including a wafer support surface disposed relative to said base member so that said housing can be positioned above said wafer support surface at a point where said second axis is coextensive with a third axis passing through a point equidistant from a plurality of depressions in said wafer support surface, said depressions being designed and positioned to receive said support arms projecting from said housing when said housing is lowered toward said support surface.

22. The apparatus of claim 21 wherein said wafer support surface has a pocket disposed symmetrically with respect to said third axis for receiving a wafer.

23. An apparatus for carrying disk shaped wafers and eliminating particulate contamination due to sliding contact comprising, in combination:
   a housing having a base;
   at least three non-deformable arms with portions thereof projecting through and not contacting said housing base and disposed substantially equidistant from a perpendicular axis passing through said housing, each said arm including a substantially horizontal flange portion projecting from said arm toward said perpendicular axis;
   a plurality of leaf springs each attached at one end to said housing and at the other end to a respective one of said arms, said leaf springs supporting said arms and permitting movement of said arms without sliding contact;
   a rotationally mounted hub disposed to rotate about said axis, said hub being coupled by at least one flexible band to each of said arms, such that said hub is in rolling and abutting contact with said bands, said hub being mounted by a roller mount; and
   hub actuating means for selectively rotating said hub between two rotational limits, one rotational limit causing said arms to be disposed wide enough apart that said apparatus cannot carry a wafer on said flanges and the second rotational limit causing said arms to be disposed close enough together that said arms can carry a wafer on said flanges.

24. The apparatus of claim 22 additionally including positioning means movable between a first and second position to raise and lower said arms between a corresponding upper and lower position, said positioning means being operative to position said arms such that movement of said arms to said wafer carrying position when said arms are in said lower position will cause said flanges to underlie a disk shaped wafer.

25. The apparatus of claim 24 wherein movement of said positioning means from said second position to said first position, while said arms are in said wafer carrying position, is operative to support a wafer on said flanges.

26. An apparatus capable of carrying a disk shaped wafer and eliminating particulate contamination due to sliding contact comprising, in combination:
   at least three non-deformable arms each having a flange projecting therefrom, each said flange being disposed in a common plane and providing, when said arms are at a wafer carrying position, a plurality of surfaces to support a wafer from below and providing, when said arms are at a wafer disengaging position, the capability to disengage a wafer; and
   mechanical actuator means including fixed elements and movable elements, said actuator means disposed above and coupled to each of said arms to support said arms and to move said arms simultaneously to either said wafer carrying position or said wafer disengaging position, wherein said movable elements comprise:
   first movable elements in rolling and abutting contact with a first set of said fixed and movable elements;
   second movable elements in rolling contact with a second set of said fixed and movable elements; and
   third movable elements in abutting contact with a third set of said fixed and movable elements.

27. The apparatus of claim 26 additionally including positioning means movable between a first and second position to raise and lower said arms between a corresponding upper and lower position, said positioning means being operative to position said arms such that movement of said arms to said wafer carrying position when said arms are in said lower position will cause said flanges to underlie a disk shaped wafer.

28. The apparatus of claim 27 wherein movement of said positioning means from said second position to said first position, while said arms are in said wafer carrying position is operative to support a wafer on said flanges.

* * * * *